United States Patent [19]
Robbins

[11] Patent Number: 5,029,191
[45] Date of Patent: Jul. 2, 1991

[54] BINARY COUNTER WITH RESOLUTION DOUBLING

[75] Inventor: Daniel C. Robbins, Tucson, Ariz.

[73] Assignee: Allied-Signal Inc., Morris Township, Morris County, N.J.

[21] Appl. No.: 471,562

[22] Filed: Jan. 29, 1990

[51] Int. Cl.⁵ .................. H03K 21/02; H03K 21/39
[52] U.S. Cl. ..................................... 377/110; 377/111
[58] Field of Search ............... 377/55, 107, 110, 111, 377/108, 114, 119

[56] References Cited

U.S. PATENT DOCUMENTS

| | | | |
|---|---|---|---|
| 3,609,392 | 9/1971 | Tetlik | 377/54 |
| 3,912,869 | 10/1975 | Ullakko | 341/54 |
| 3,928,798 | 12/1975 | Valis | 324/78 D |
| 3,930,169 | 12/1975 | Kuhn, Jr. | 377/111 |
| 3,967,205 | 6/1976 | Rossi et al. | 377/108 |
| 3,992,635 | 11/1976 | Suzuki et al. | 377/111 |
| 4,107,600 | 8/1978 | McMannis | 324/78 R |
| 4,147,966 | 4/1979 | Kain et al. | 388/814 |
| 4,200,842 | 4/1980 | Monnier | 377/110 |
| 4,656,649 | 4/1987 | Takahashi | 377/111 |
| 4,786,861 | 11/1988 | Hulsing, II et al. | 324/78 R |

Primary Examiner—John S. Heyman
Attorney, Agent, or Firm—Joseph R. Black; James W. McFarland; Robert A. Walsh

[57] ABSTRACT

A binary counter (60) provides for resolution doubling by producing a wavetrain (Q0) which represents the zero-order bit of the counter and has the same frequency as the clock input (REFCLOCK).

15 Claims, 4 Drawing Sheets

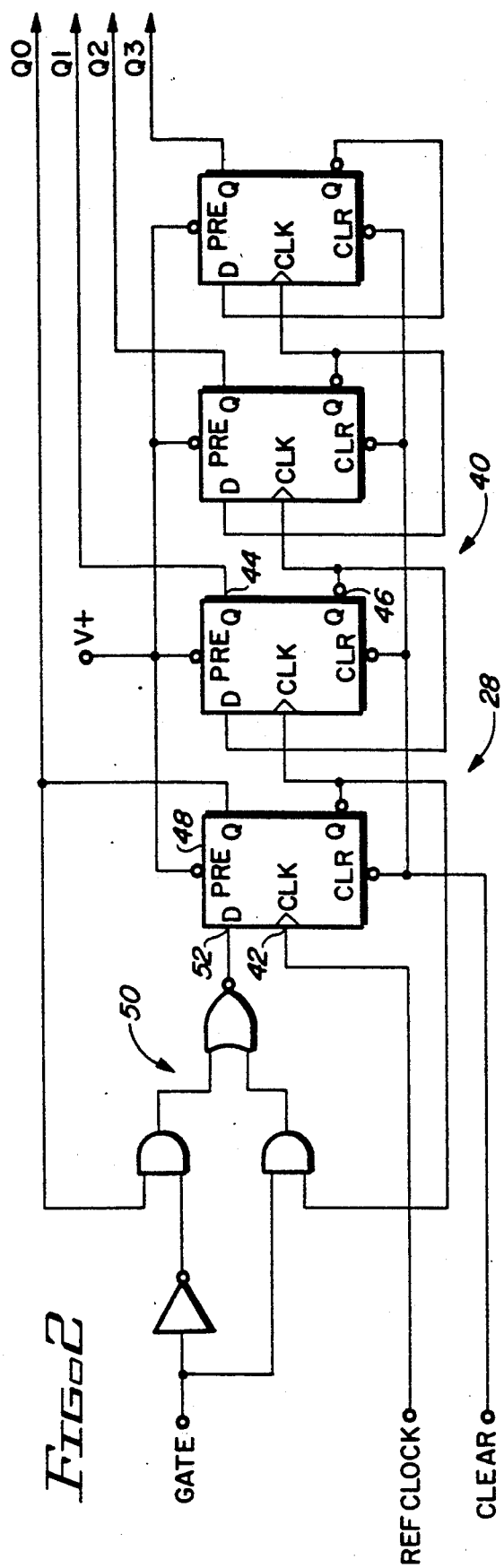
_FIG. 2_
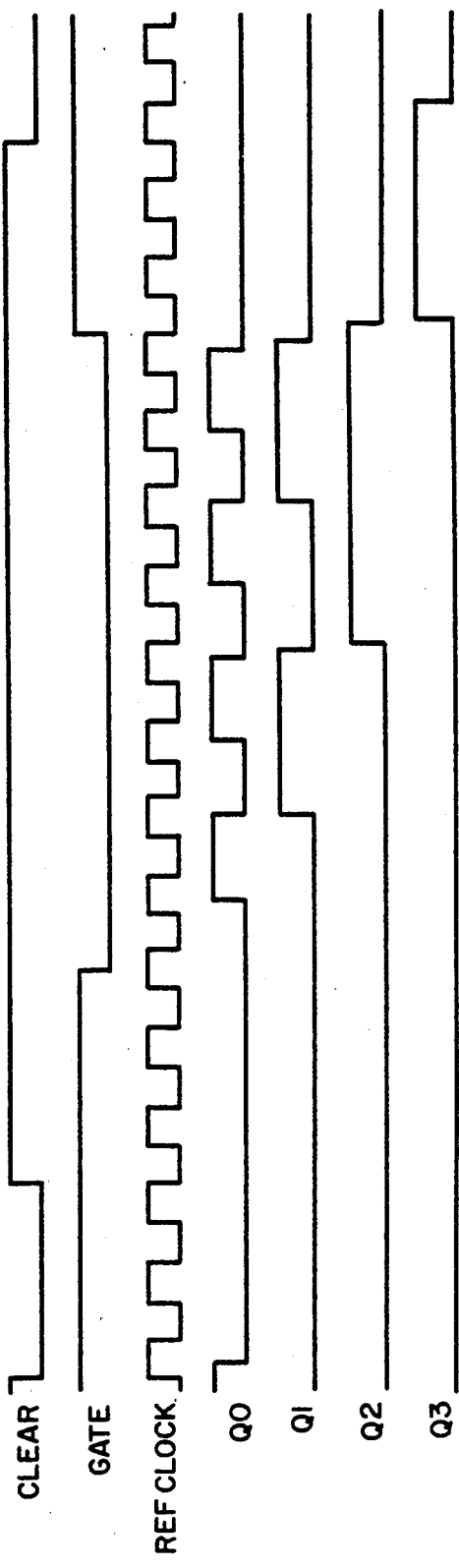
_FIG. 3_

BINARY COUNTER WITH RESOLUTION DOUBLING

TECHNICAL FIELD

The present invention relates generally to frequency-to-digital conversion and more specifically to binary counters for use therein. Still more specifically, the invention relates to a binary counter designed to provide increased resolution.

BACKGROUND OF THE INVENTION

Binary counters are used in frequency-to-digital conversion to effect binary quantization of a variable-frequency signal. This is done in order to provide the frequency data in a form which is suitable for digital system processing. An exemplary application is illustrated in FIG. 1 of the accompanying drawings.

A sensor 10 forms part of an oscillator 12 which produces a square-wave output 14 indicative of the physical attribute (e.g. pressure) which the sensor is designed to measure. This output 14 is communicated to a prescaler 16 which produces as its output 18 a programmable, integral number of periods of the oscillator output 14. The prescaler output 18 is communicated to a control circuit 20. The control circuit 20, upon receiving a first command signal 22 from a microprocessor 24, generates a signal 26 which clears a binary counter 28. The signal 26 is again communicated to the counter 28 at its opposite state or logic level. This is followed by a gate enable signal 30, thus initiating a counting cycle which results in frequency-to-digital conversion. The control circuit 20, responding to the prescaler output 18, provides the gate enable signal 30 at a pulse width which is proportional to the oscillator output 14. The binary counter 28 receives a clock signal 32 communicated from a digital high-speed oscillator 34 as a wavetrain. The counter 28 successively divides the frequency of the clock signal 32 and generates an output 36. While enabled, the output 36 of the counter 28 is a plurality, "n", of wavetrains, each representing the bit state (i.e. 0 or 1) of a different whole-number order or power of the number two. To effect such representation, each wavetrain of successively higher order has a frequency which is half that of the wavetrain associated with the immediately lower order. Thus, if the zero-order wavetrain has a frequency of "f", then the first-order wavetrain has a frequency of "f/2", and so on, with the nth-order wavetrain having a frequency of "f/(n+1)". After the control circuit 20 ends the counting cycle via communication of a gate disable signal 30 to the counter 28, it sends a signal 38 to an interrupt input of the microprocessor 24. The bit states of the wavetrains at the end of the counting cycle are then read by the microprocessor 24 as a binary number representing a frequency datum.

An exemplary four-bit conventional binary counter 28 is illustrated in FIG. 2. The above-described frequency division is typically accomplished by a series 40 of D-type flip-flops. Each flip-flop receives a wavetrain at its clock input (as at 42) and provides at its true output (as at 44) a wavetrain having half the frequency of the input. The complement output (as at 46) of the flip-flop is an inverted wavetrain otherwise identical to the true output 44, and is communicated to the clock input of the next succeeding flip-flop. The original clock wavetrain ("REFCLOCK") is provided by an oscillator 32 (FIG. 1) and communicated to the clock input of the first-stage flip-flop 48. The output Q0 of the first-stage flip-flop 48 is the zero-order wavetrain, this having a frequency which is half that of REFCLOCK. The outputs Q1, Q2, Q3 of the second, third, and fourth flip-flops are the first-order, second-order, and third-order wavetrains, respectfully. The counting cycle is initiated and terminated by the gate signal ("GATE"), which is communicated through an AND-OR gate 50 to the "D" input 52 of the first-stage flip-flop 48. The counter 28 is cleared by a clear signal ("CLEAR") received between successive counting cycles. The timing associated with the data inputs GATE, REFCLOCK, CLEAR and data outputs Q0 . . . Q3 is illustrated in FIG. 3.

The resolution with which a binary counter can quantize frequency data is fundamentally limited by the frequency of the original clock wavetrain, REFCLOCK. Conventional binary counters further narrow this fundamental limitation by dividing that frequency before producing the zero-order wavetrain, Q0.

The primary objective of this invention is to double the resolution with which binary counter circuits quantize frequency data.

A further objective of the invention is to provide both synchronous and ripple binary counter circuits which achieve the primary objective.

SUMMARY OF THE INVENTION

This invention achieves the above-stated objectives by providing binary counters which are operable to produce a zero-order output wavetrain having a frequency which matches that of a clock input wavetrain. Accordingly, each output wavetrain of any particular order has a frequency which is double that produced by a conventional counter for the same order.

BRIEF DESCRIPTION OF THE DRAWINGS

FIG. 2 is a schematic drawing of a conventional binary counter.

FIG. 3 is a timing diagram illustrating electronic data inputs and outputs for the counter illustrated in FIG. 2.

DESCRIPTION OF THE PREFERRED EMBODIMENT

Figure 4:
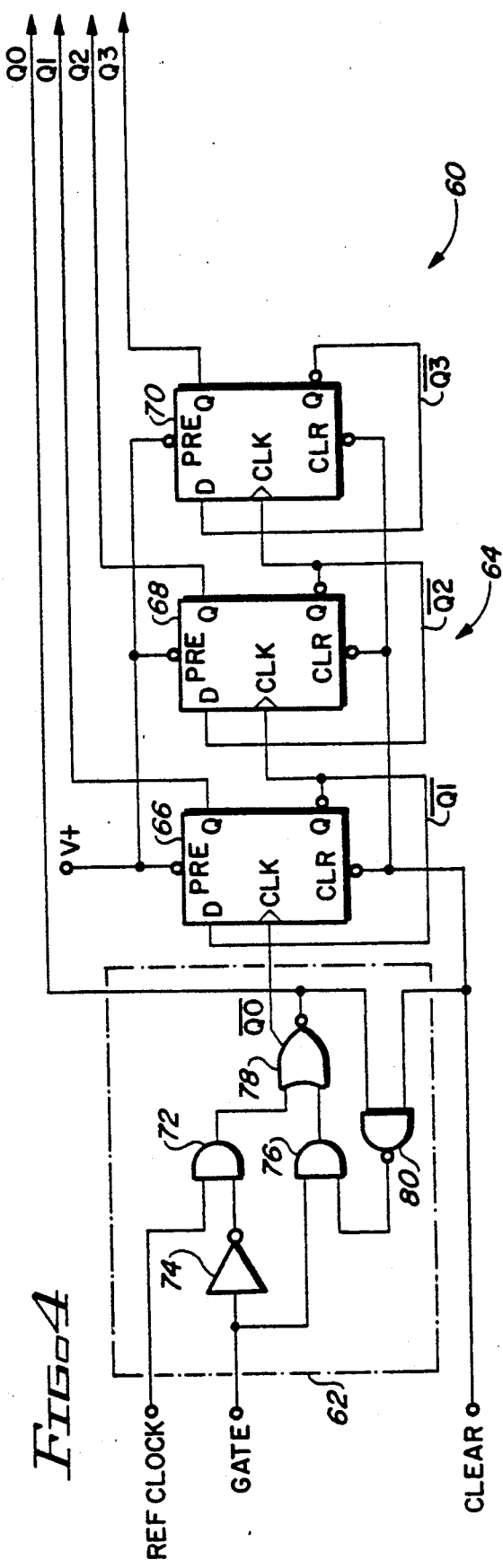
FIG. 4 is a schematic drawing of a binary counter in accordance with the preferred embodiment of the invention.

FIG. 4 illustrates a binary counter 60 in accordance with the preferred embodiment which comprises a transparent latch 62 and a series 64 of three D-type flip-flops connected as shown. Although a four-bit counter is illustrated, it will be understood that the invention can be easily adapted for use with counters of higher order by providing more flip-flops or functionally equivalent electronic data storage and division circuits as needed.

The transparent latch 62 is adapted by the provision of wires, connectors, or functionally equivalent conducting elements to receive three data inputs, these having been designated as a reference clock input ("REFCLOCK"), a gate input ("GATE") and a clear input ("CLEAR"). The latch 62 is adapted by similar means in combination with suitable digital logic elements to produce a true output Q0 and a complement output $\overline{Q0}$. The input for CLEAR is connected to the clear inputs of each of the flip-flops as indicated. The true output Q0 of the latch 62 is the zero-order wavetrain during the counting cycle. The complement output $\overline{Q0}$ of the latch 62 is communicated to the clock input of the first-stage flip-flop 66. The complement output $\overline{Q1}$ of the first-stage flip-flop 66 is fed back to the "D" input of the same and is also communicated to the clock input of the second-stage flip-flop 68. The complement output $\overline{Q2}$ of the second-stage flip-flop 68 is fed back to the "D" input of the same and is connected to the clock input of the third-stage flip-flop 70. The preset input of each flip-flop is tied at high potential as indicated. The true outputs Q1, Q2, Q3 of the first, second, and third flip-flops 66, 68, 70 are the first-order second-order, and third-order wavetrains during the counting cycle.

Within the preferred transparent latch 62, the input for REFCLOCK is connected to one input of a first AND gate 72. The input for GATE is connected to the input of an inverter 74 and to an input of a second AND gate 76. The output of the inverter is connected to the remaining input of the first AND gate 72. The output of the first AND gate 72 is connected to an input of a NOR gate 78. The noninverted output signal from the NOR gate 78 is the complement output $\overline{Q0}$ of the latch 62. The inverted output signal from the NOR gate 78 is the true output $\overline{Q0}$ of the latch 62. The output of the NOR gate 78 is connected to an input of a NAND gate 80 which in turn receives the CLEAR signal at its remaining input. The output of the NAND gate 80 is connected to the remaining input of the second AND gate 76.

Figure 5:
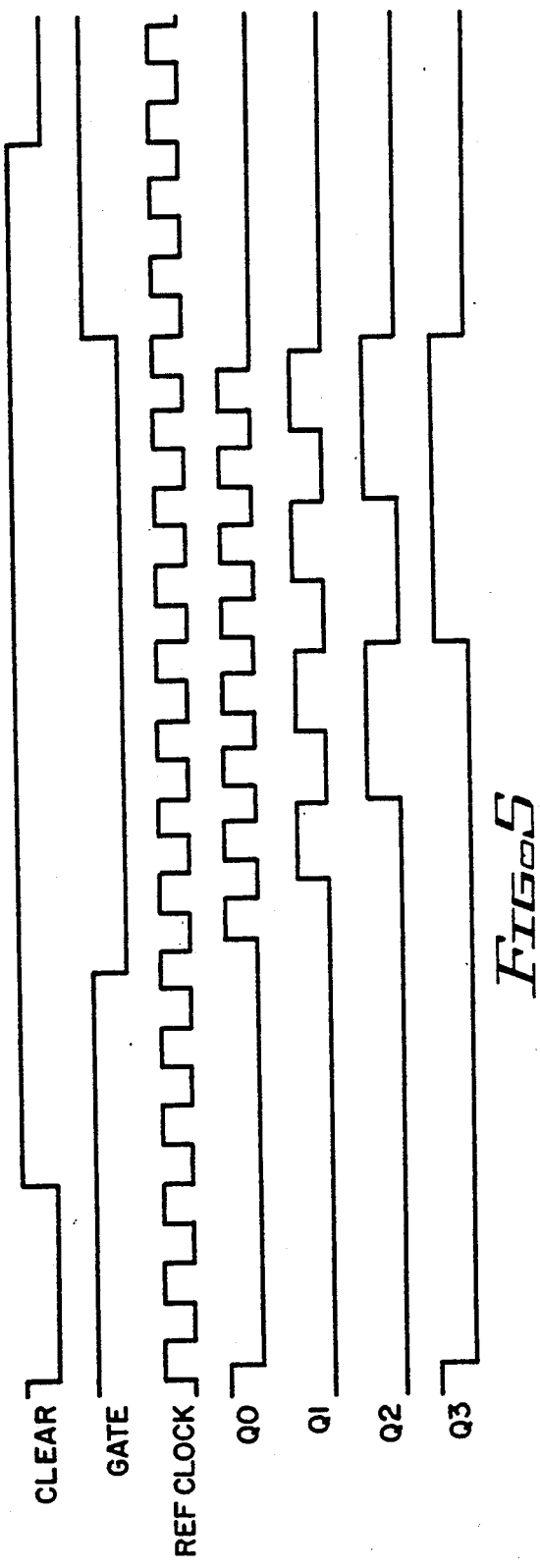
FIG. 5 is a timing diagram illustrating electronic data inputs and outputs for the counter illustrated in FIG. 4.

Operation of the counter 60 can be understood by reference to FIGS. 4 and 5. In use, the latch 62 receives REFCLOCK as a continuous wavetrain. When the counter 60 is not in a counting cycle, GATE is set high, (i.e. to logic level one). To clear the counter 60, CLEAR is brought low (i.e. to logical zero). Prior to initiation of the counting cycle, CLEAR is brought high. To initiate the counting cycle, GATE is brought low. During the counting cycle, the true output Q0 of the latch 62 follows REFCLOCK as a wavetrain of matching frequency, as illustrated in FIG. 5. The complement output $\overline{Q0}$ toggles the first-stage flip-flop 66 and the latter functions as a frequency divider in the conventional manner to output Q1 as a first-order wavetrain. Similarly, $\overline{Q1}$ toggles the second-stage flip-flop 68 which outputs Q2 as a second-order wavetrain, and $\overline{Q2}$ toggles the third-stage flip-flop 70 which outputs Q3 as a third-order wavetrain. The counting cycle is terminated when GATE is brought high, after which the states of all true and complement outputs are saved.

Figures 6, 7:
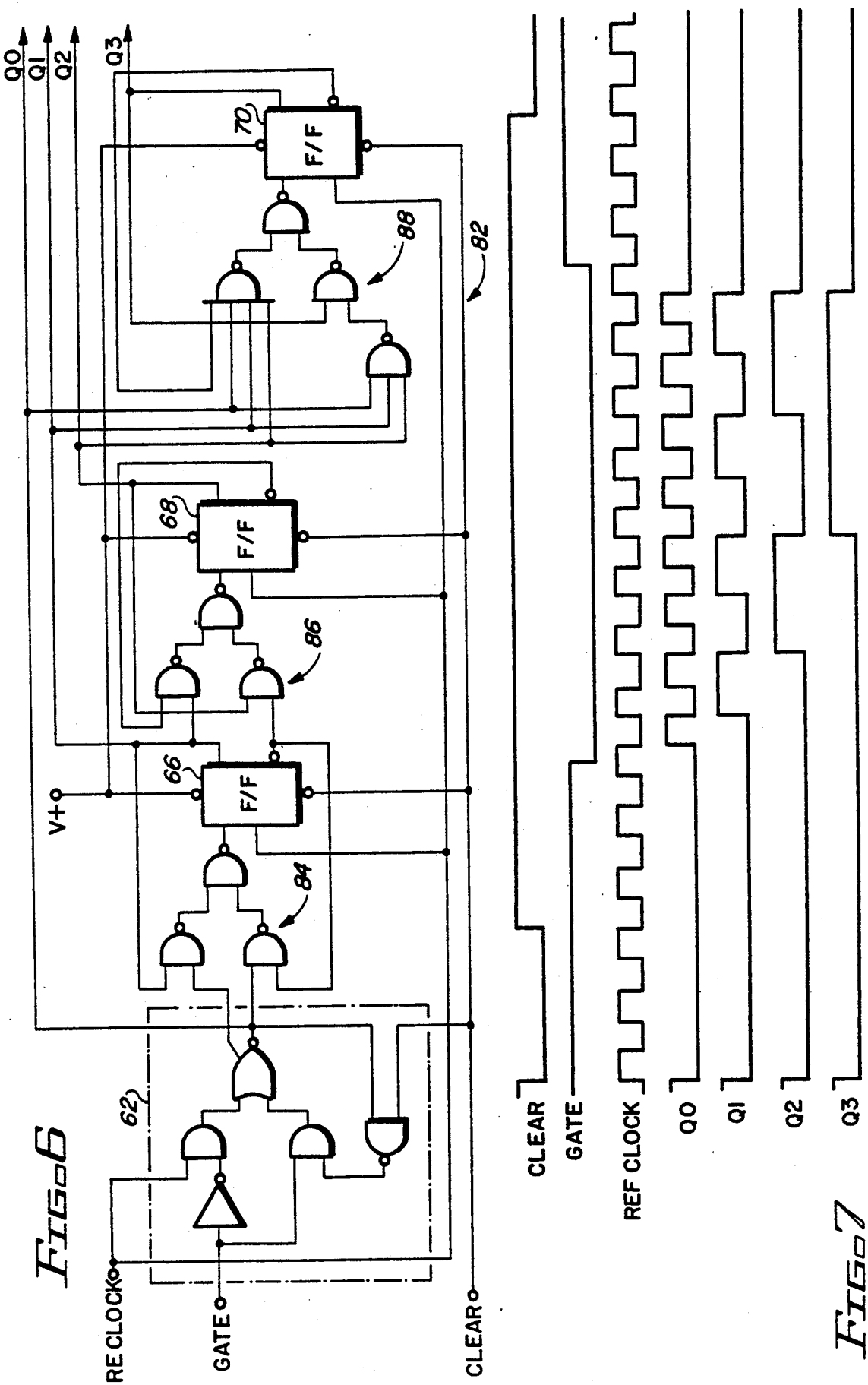
FIG. 6 is a schematic drawing of a further embodiment of the invention.
FIG. 7 is a timing diagram illustrating eletronic data inputs and outputs for the embodiment illustrated in FIG. 6.

In ripple counters such as that illustrated in FIG. 4 the clock signal input to the first-stage flip-flop 66 is successively passed through in frequency-divided form to the remaining stages. Such counters are preferable over synchronous counters because they can be employed at a higher REFCLOCK frequency, and with lower power dissipation at a given REFCLOCK frequency. However, the invention can be used in a synchronous counter 82, this being exemplified in the embodiment of FIG. 6. The associated timing diagram is provided in FIG. 7. NAND gate combinations 84, 86, 88 are added to provide decoding for each flip-flop 66, 68, 70.

Figure 1:
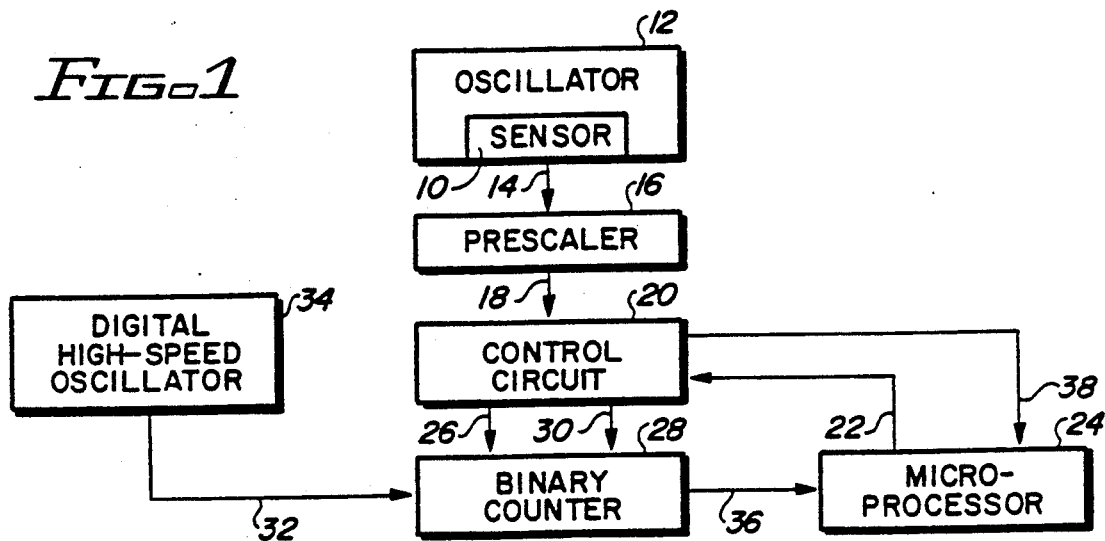
FIG. 1 is a schematic diagram of an exemplary application for binary counters.
Figure 8:
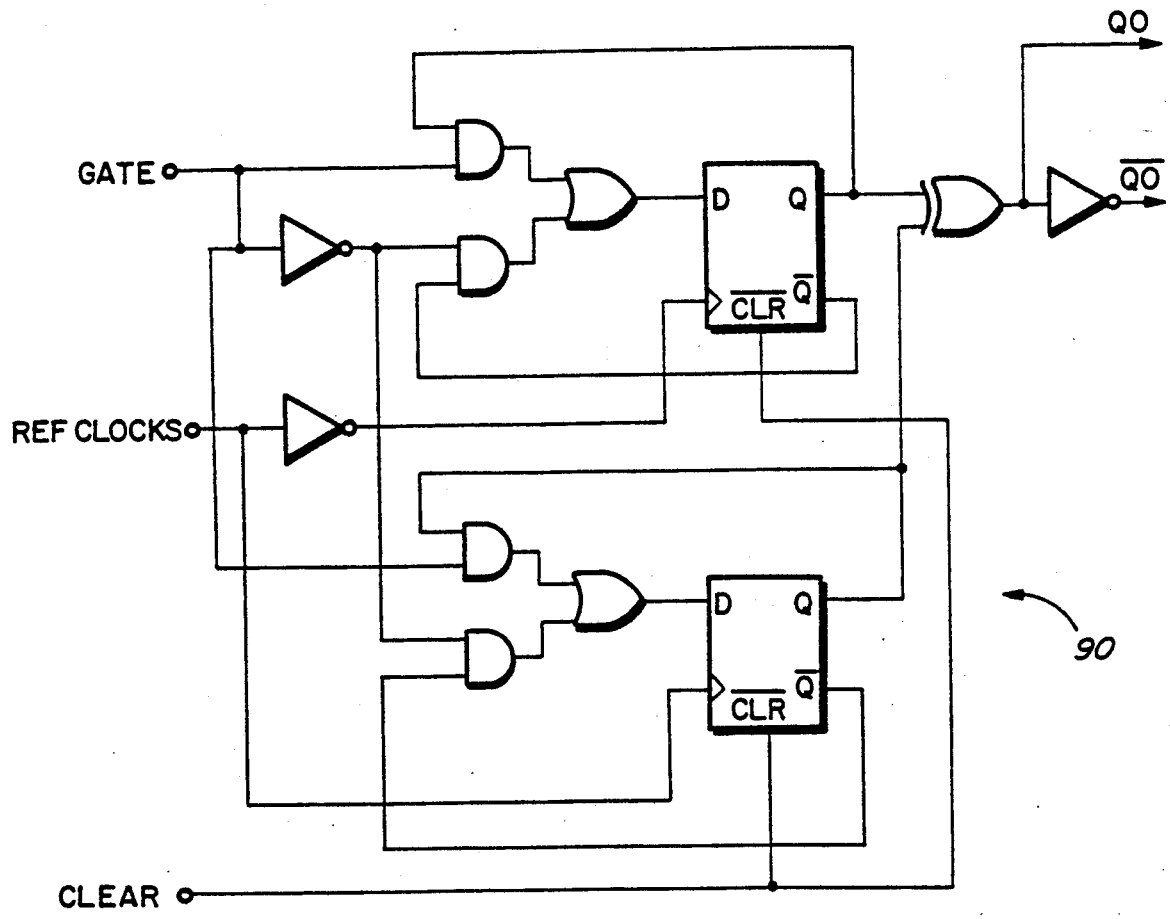
FIG. 8 is a schematic drawing exemplifying an electronic data storage circuit that can be used in accordance with the invention as an alternative to a transparent latch.

The relatively high processing speed of a transparent latch recommends it as the most expedient type of data storage circuit for producing the zero-order wavetrain. Many functionally equivalent circuits can be used in accordance with the invention, as is exemplified by the circuit 90 in the embodiment of FIG. 8, though with less efficiency. Similar considerations recommend the use of D-type flip-flops for frequency division. However, frequency division is a well-entrenched function of binary counters and can be performed by innumerable means. The reader should understand that the gist of the present invention is the provision of binary counters which produce zero-order wavetrains prior to frequency division.

Accordingly, the foregoing portion of the description, which includes the accompanying drawings, is not intended to restrict the scope of the invention to the illustrated embodiments or to specific details which are ancillary to the teaching contained herein. The invention should be construed in the broadest manner which is consistent with the following claims and their equivalents.

What is claimed is:

1. A binary counter adapted to receive three electronic data inputs including a gate signal, a clear signal, and a clock wavetrain; said counter being operable in response to said inputs to output a plurality of output wavetrains whose bit states are collectively readable as a binary number; said counter comprising in combination:

an electronic data storage circuit connected to receive said data inputs and to output first and second complementary outputs; said circuit being operable when enabled by a first state of said gate signal to output said complementary outputs as wavetrains having a frequency matching that of said clock wavetrain; said circuit being operable when disabled by a second state of said gate signal to maintain states for said complementary outputs; and a plurality of interconnected flip-flops exceeded in number by said output wavetrains; the flip-flops being operatively connected to the data storage circuit to receive said clear signal and to receive at a first stage said second complementary output;

said output wavetrains including a zero-order wavetrain which corresponds to said first complementary output when said data storage circuit is enabled.

2. The invention of claim 1 wherein said 2 counter is a ripple counter.

3. The invention of claim 1 wherein said 2 storage circuit comprises a transparent latch.

4. The invention of claim 1 wherein said data storage circuit comprises logic means responsive to said data inputs for generating said complementary outputs; said logic means comprising a plurality of gates.

5. The invention of claim 4 wherein one of said plurality of gates is operatively connected to receive said clear signal and one of said complementary outputs as its inputs.

6. A binary counter apparatus adapted to receive three electronic data inputs including a gate signal, a clear signal, and a clock wavetrain, said apparatus being operable in response to said inputs to cyclically output a plurality of electronic data outputs having bit states which are collectively readable as a binary number; said plurality comprising a zero-order wavetrain having a frequency which matches that of said clock wavetrain, and a first-order wavetrain having a frequency which is half that of said zero-order wavetrain, said apparatus comprising in combination:

an electronic data storage circuit connected to receive said data inputs and to output first and second complementary outputs, said first complementary output including said zero-order wavetrain; said circuit being operable when enabled by a first state of said gate signal to output said complementary outputs as wavetrains having a frequency matching that of said clock wavetrain; said circuit being operable when disabled by a second state of said gate signal to maintain states for said complementary outputs; and a first-stage electronic data storage and frequency division circuit, connected to receive said clear signal; said storage and division circuit being operatively connected to said storage circuit to output said first-order wavetrain when said storage circuit is enabled by said first state.

7. The invention of claim 6 wherein said counter is a ripple counter.

8. The invention of claim 7 wherein said storage circuit comprises a transparent latch.

9. The invention of claim 8 wherein said storage and division circuit comprises a flip-flop.

10. The invention of claim 6 further comprising second-stage and third-stage electronic data storage and frequency division circuits; said second and third stage circuits being cooperable with said storage circuit and said first-stage circuit to output second-order and third-order wavetrains; said second-order wavetrain having a frequency which is half that of said first-order wavetrain, and said third-order wavetrain having a frequency which is half that of said second-order wavetrain.

11. The invention of claim 10 wherein said counter is a ripple counter.

12. The invention of claim 10 wherein said storage circuit comprises a transparent latch.

13. The invention of claim 12 wherein each of said storage and division circuits comprises a flip-flop.

14. The invention of claim 7 wherein said data storage circuit comprises logic means responsive to said data inputs for generating said complementary outputs; said logic means comprising a plurality of gates.

15. The invention of claim 14 wherein one of said plurality of gates is operatively connected to receive said clear signal and one of said complementary outputs as its inputs.

* * * * *